(12) United States Patent
Zhang et al.

(10) Patent No.: US 12,433,037 B2
(45) Date of Patent: Sep. 30, 2025

(54) SOLAR CELL AND METHOD FOR PREPARING THE SAME

(71) Applicant: TRINA SOLAR CO., LTD., Changzhou (CN)

(72) Inventors: Zhuohan Zhang, Changzhou (CN); Daming Chen, Changzhou (CN); Yunyun Hu, Changzhou (CN); Wei Liu, Changzhou (CN); Wenxian Ji, Changzhou (CN); Rui Yang, Changzhou (CN); Guanchao Xu, Changzhou (CN); Xueling Zhang, Changzhou (CN); Guangtao Yang, Changzhou (CN); Yifeng Chen, Changzhou (CN)

(73) Assignee: TRINA SOLAR CO., LTD., Changzhou (CN)

( * ) Notice: Subject to any disclaimer, the term of this patent is extended or adjusted under 35 U.S.C. 154(b) by 0 days.

(21) Appl. No.: 18/243,803

(22) Filed: Sep. 8, 2023

(65) Prior Publication Data
US 2023/0420593 A1  Dec. 28, 2023

(30) Foreign Application Priority Data

Mar. 31, 2023 (CN) .......................... 202310341102.9

(51) Int. Cl.
*H10F 10/142* (2025.01)
*H10F 71/00* (2025.01)
*H10F 77/30* (2025.01)

(52) U.S. Cl.
CPC ......... *H10F 10/142* (2025.01); *H10F 71/129* (2025.01); *H10F 77/311* (2025.01)

(58) Field of Classification Search
CPC .... H10F 10/146; H10F 19/908; H10F 77/219; H10F 77/227; H01L 31/0682
See application file for complete search history.

(56) References Cited

U.S. PATENT DOCUMENTS

| 8,580,599 B2 | 11/2013 | Rim |
| 11,489,080 B1 * | 11/2022 | Chen ..................... H10F 77/30 |

(Continued)

FOREIGN PATENT DOCUMENTS

| CN | 202363468 U | 8/2012 |
| CN | 103794679 A | 5/2014 |

(Continued)

OTHER PUBLICATIONS

Liu, CN-103794679-B, Machine Translation, 2016 (Year: 2016).*

(Continued)

*Primary Examiner* — Devina Pillay
(74) *Attorney, Agent, or Firm* — Taft Stettinius & Hollister LLP

(57) ABSTRACT

The present disclosure provides a solar cell including a substrate, a first emitter, a second emitter, an insulating spacing structure, a first electrode, and a second electrode. The substrate includes a front surface and a back surface opposite to each other. The first emitter and the second emitter are disposed on the back surface of the substrate. The first electrode is disposed on a side of the first emitter away from the substrate, and the first electrode is electrically connected to the first emitter. The second electrode is disposed on a side of the second emitter away from the substrate, and the second electrode is electrically connected to the second emitter. The insulating spacing structure is disposed between the first emitter and the second emitter, and the first emitter and the second emitter are spaced from each other by the insulating spacing structure.

19 Claims, 6 Drawing Sheets

(56) References Cited

U.S. PATENT DOCUMENTS

| | | | |
|---|---|---|---|
| 2013/0092224 A1 | 4/2013 | Lee et al. | |
| 2014/0311567 A1 | 10/2014 | Choi et al. | |
| 2015/0007879 A1 | 1/2015 | Kwon | |
| 2020/0058810 A1* | 2/2020 | Hashigami | H01L 31/0682 |
| 2020/0313016 A1* | 10/2020 | Smith | H01L 31/03529 |
| 2022/0393043 A1* | 12/2022 | Qiu | H01L 31/028 |

FOREIGN PATENT DOCUMENTS

| | | | | |
|---|---|---|---|---|
| CN | 104465803 | A | | 3/2015 |
| CN | 103794679 | B | * | 7/2016 |
| CN | 106531816 | A | | 3/2017 |
| CN | 113284961 | A | * | 8/2021 ......... H01L 31/0216 |
| CN | 113299769 | A | * | 8/2021 ....... H01L 31/02167 |
| CN | 113823705 | A | | 12/2021 |
| CN | 215070001 | U | * | 12/2021 |
| CN | 113921625 | A | | 1/2022 |
| CN | 114823991 | A | | 7/2022 |
| CN | 115588698 | A | | 1/2023 |
| JP | 2003124483 | A | | 4/2003 |
| JP | 2009158575 | A | | 7/2009 |
| JP | 2011523230 | A | | 8/2011 |
| JP | 2011181606 | A | | 9/2011 |
| JP | 2013089954 | A | | 5/2013 |
| JP | 2016501452 | A | | 1/2016 |
| JP | 2016506077 | A | | 2/2016 |
| JP | 2018107480 | A | | 7/2018 |
| JP | 2023033029 | A | | 3/2023 |
| WO | 2006120735 | A1 | | 11/2006 |

OTHER PUBLICATIONS

Chen, CN-215070001-U, Machine Translation, 2021 (Year: 2021).*

Japanese Patent Office, Office Action issued in corresponding Application No. 2023-144247, dated Aug. 14, 2024, 14 pp.

Australian Examination Report No. 1 for corresponding Application No. 2023216789 dated Sep. 8, 2023, 8 pages.

Rienacker Michael et al: "Recombination 1-15 Behavior of Photolithography-free Back Junction Back Contact Solar Cells with Carrier-selective Polysilicon on Oxide Junctions for Both Polarities", Energy Procedia, Elsevier, NL, H01L vol. 92, pp. 412-418 (2016).

Reichel Christian et al: "Influence of the transition region between p- and n-type polycrystalline silicon passivating contacts on the performance of interdigitated back contact silicon solar cells", Journal of Applied Physics, vol. 122, No. 18 (2017).

Krugener Jan et al: "Improvement of the SRH bulk lifetime upon formation of n-type POLO junctions for 25% efficient Si solar cells", Solar Energy Materials and Solar Cells, vol. 173, pp. 85-91 (2017).

European Search Report for corresponding application No. EP23193516.4 dated Feb. 23, 2024, 8 pages.

Chinese Patent Office, First Office Action issued in corresponding Application No. 202310341102.9, dated Dec. 13, 2024, 15 pp.

* cited by examiner

SOLAR CELL AND METHOD FOR PREPARING THE SAME

CROSS-REFERENCE TO RELATED APPLICATION

This application claims priority to Chinese patent application No. 202310341102.9, filed on Mar. 31, 2023, and titled "SOLAR CELL AND METHOD FOR PREPARING THE SAME", the content of which is hereby incorporated herein in its entirety by reference.

TECHNICAL FIELD

The present application relates to the technical field of solar cells, and particularly to a solar cell and a method for preparing the same.

BACKGROUND

Solar cells are such devices that can directly convert solar energy into electrical energy. Since solar energy is nearly infinite and clean, solar cells have great development potential and application prospects.

A solar cell has a front side that receives sunlight and a back side opposite to the front side. Typically, the solar cell has a front electrode which is disposed on the front side and a back electrode which is disposed on the back side. Electrons and holes of the photogenerated carriers are respectively collected from the front side and the back side to form a current. However, the front electrode on the front side may shield part of the sunlight entering the solar cell, reducing the light absorption efficiency of the solar cell.

The interdigitated back contact (IBC) solar cell is a highly efficient solar cell structure whose electrodes are all disposed on the back side to improve the efficiency of the solar cell.

SUMMARY

According to some embodiments of the present disclosure, a solar cell is provided, which includes a substrate, a first emitter, a second emitter, an insulating spacing structure, a first electrode, and a second electrode.

The substrate includes a front surface and a back surface opposite to each other. The first emitter and the second emitter are disposed on the back surface of the substrate. The doping type of the first emitter is a first doping type. The doping type of the second emitter is a second doping type opposite to the first doping type. The first electrode is disposed on a side of the first emitter away from the substrate, and the first electrode is electrically connected to the first emitter. The second electrode is disposed on a side of the second emitter away from the substrate, and the second electrode is electrically connected to the second emitter.

The insulating spacing structure is disposed between the first emitter and the second emitter, and the first emitter and the second emitter are spaced from each other by the insulating spacing structure.

In some embodiments, the insulating spacing structure is annular shaped, the first emitter is disposed in the outer area defined by the insulating spacing structure, and the second emitter is disposed in the inner area defined by the insulating spacing structure.

In some embodiments, the solar cell further includes a remaining doped portion, wherein a material and a doping type of the remaining doped portion are the same as those of the first emitter, and the remaining doped portion is disposed in the inner area defined by the insulating spacing structure, and is disposed between the second emitter and the insulating spacing structure.

In some embodiments, the insulating spacing structure includes an annular spacing groove. Optionally, the back surface of the substrate is exposed through the spacing groove.

In some embodiments, a groove width of the spacing groove is in a range from 1 μm to 100 μm.

In some embodiments, the insulating spacing structure further includes an insulating member disposed in the spacing groove.

In some embodiments, the solar cell further includes a back passivation layer disposed on the side of the first emitter away from the substrate and the side of the second emitter away from the substrate. Optionally, the back passivation layer and the insulating member are an integrated structure.

In some embodiments, the solar cell further includes a passivation contact structure disposed on a surface of the first emitter away from the substrate, wherein the passivation contact structure includes a tunnel oxide layer and a polysilicon layer, the tunnel oxide layer and the polysilicon layer are sequentially stacked on the first emitter, and the polysilicon layer has the first doping type.

In some embodiments, a thickness of the tunnel oxide layer is in a range from 1 nm to 2 nm; and/or a thickness of the polysilicon layer is in a range from 10 nm to 300 nm.

In some embodiments, the back surface of the substrate includes a first region and a second region outside the first region, the passivation contact structure is disposed in the first region and covers the first region, and the insulating spacing structure is disposed in the second region.

In some embodiments, the insulating spacing structure includes a plurality of insulating spacing structures, and the second emitter includes a plurality of second emitters; the second electrode includes a connecting portion and a plurality of electrode portions, the plurality of electrode portions are respectively in contact with the plurality of second emitters, the plurality of electrode portions are respectively disposed in the inner area defined by the plurality of insulating spacing structures, the connecting portion is connected to the plurality of electrode portions, and the plurality of electrode portions and the connecting portion are all disposed in the second region.

According to some other embodiments of the present application, a method for preparing a solar cell is provided, including steps of:

providing a substrate including a front surface and a back surface opposite to each other;

forming a first doped layer on the back surface of the substrate, the first doped layer covering the substrate, and the first doped layer having a first doping type;

forming an insulating spacing structure in the first doped layer, thereby allowing the first doped layer located at one side of the insulating spacing structure to be the first emitter;

forming a second emitter at another side of the insulating spacing structure, the second emitter being spaced from the first emitter by the insulating spacing structure, and the second emitter having a second doping type; and forming a first electrode electrically connected to the first emitter, and forming a second electrode electrically connected to the second emitter.

In some embodiments, the step of forming the insulating spacing structure includes:

etching the first doped layer to form an annular spacing groove penetrating through the first doped layer, wherein the insulating spacing structure includes the spacing groove.

In some embodiments, after forming the spacing groove, the method further includes cleaning and texturing the substrate by placing the substrate in a texturizing agent, thereby forming a textured structure in the front surface of the substrate.

In some embodiments, before forming the second emitter, the method further includes:

forming an insulating passivation material on the back surface of the substrate, wherein the passivation material located in the spacing groove forms an insulating member, the insulating spacing structure includes the insulating member, and the passivation material located on the first doped layer forms a back passivation layer.

In some embodiments, the step of forming the first doped layer includes:

sequentially forming a tunnel oxide layer and a silicon material layer on the back surface of the substrate;

diffusing a doping element into the silicon material layer; and annealing the silicon material layer to form a polysilicon layer having a first doping type;

wherein in the annealing step, the doping element is diffused into the substrate material, thereby forming the first doped layer covering the substrate.

In some embodiments, the back surface of the substrate includes a first region and a second region outside the first region, and after forming the polysilicon layer, the method further includes:

removing the polysilicon layer and the tunnel oxide layer in the second region.

The embodiments of the solar cell provided in the present application includes a first emitter and a second emitter disposed on the back surface of the substrate, and further includes an insulating spacing structure. The first emitter and the second emitter are spaced by the insulating spacing structure. The solar cell can effectively separate the first emitter from the second emitter by introducing the insulating spacing structure, avoiding the recombination of carriers on the interface between the first emitter and the second emitter, thus effectively reducing the reverse leakage of the solar cell and improving the efficiency of the solar cell.

The above description is only a summary of the technical solutions of the present application. The following detailed description with reference to the accompanying drawings and embodiments is provided to enable those skilled in the art to better understand, make and use the technical solutions of the present application according to the specification.

BRIEF DESCRIPTION OF THE DRAWINGS

In order to more clearly describe the embodiments of the present application, the accompanying drawings to be used in the description of the embodiments will be described briefly. Obviously, the drawings described below are only for some embodiments of the present application. For ordinary skilled persons in the art, drawings for other embodiments can also be obtained based on the following drawings without creative work.

Figure 1:
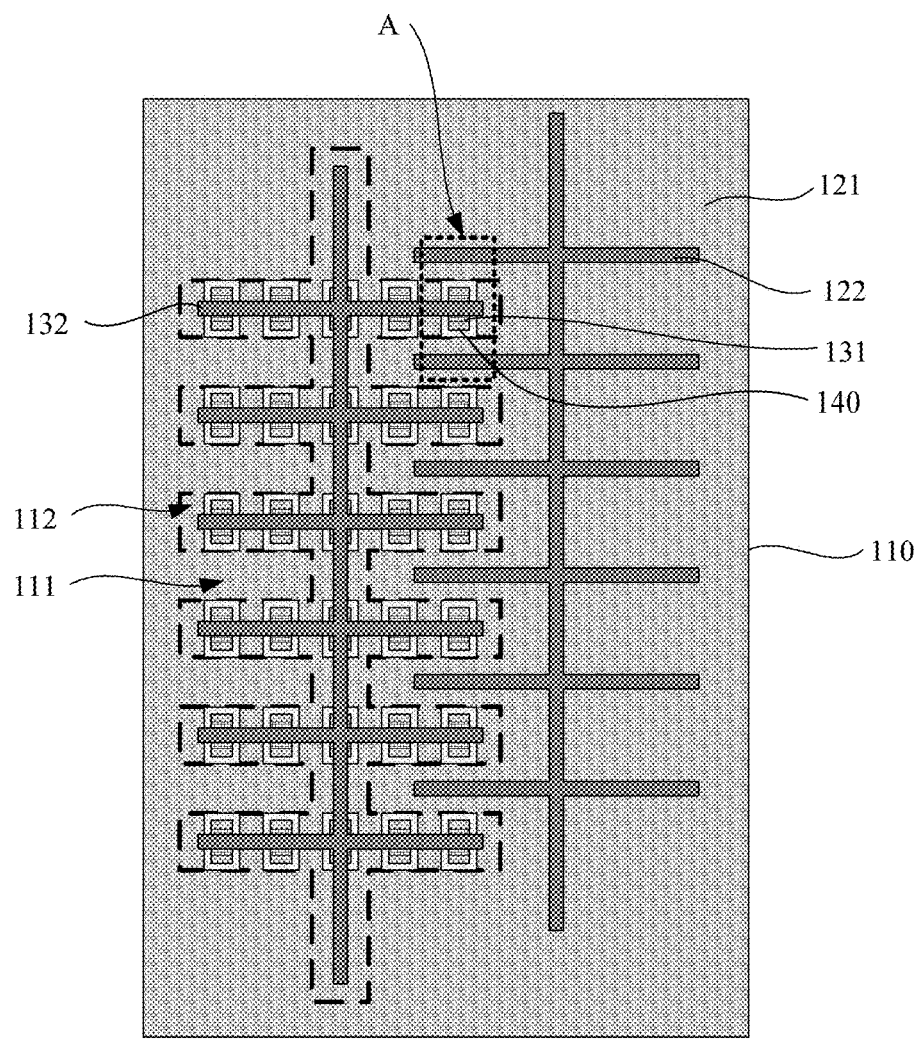
FIG. 1 is a schematic structural view of a back side of a solar cell according to an embodiment of the present application.

The reference signs and their meanings are as follows:

110, substrate; 111, first region; 112, second region; 1201, first doped layer; 121, first emitter; 122, first electrode; 131, second emitter; 132, second electrode; 1321, electrode portion; 1322, connecting portion; 140, insulating spacing structure; 141, spacing groove; 142, insulating member; 150, remaining doped portion; 161, tunnel oxide layer; 162, polysilicon layer; 171, first back passivation layer; 172, second back passivation layer; 181, first front passivation layer; 182, second front passivation layer; 210, substrate; 211, first region; 212, second region; 221, first emitter; 222, first electrode; 231, second emitter; 232, second electrode; 240, insulating spacing structure.

DETAILED DESCRIPTION

The present application will now be described in detail with reference to the accompanying drawing in order to facilitate understanding of the present application. Embodiments of the present application are shown in the drawings. However, the present application can be implemented in many different forms and therefore is not limited to the embodiments described herein. On the contrary, the purpose of providing these embodiments is to make the understanding of the present disclosure more thorough and comprehensive.

Unless otherwise specified, all the technical and scientific terms herein shall be understood as the same meaning with those commonly accepted by a person skilled in the art. Such terms, as used herein, are for the purpose of describing exemplary examples of, and without limiting, the present disclosure. The term "and/or" as used herein refers to any and all combinations of one or more items recited.

It should be understood that when an element or a layer is referred to as being "on", "adjacent to", "connected to", or "coupled to" another element or layer, it can be directly on, adjacent to, connected to, or coupled to another element or layer, or an intermediate element or layer can be present. In contrast, when an element is referred to as being "directly on", "directly adjacent to", "directly connected to", or "directly coupled to" another element or layer, there is no intervening element or layer. It can be understood that although the terms first, second, third etc. may be used to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section described below can be termed as a second element, component, region, layer or section without departing from the teachings of the present application.

For the convenience of description, the spatial relation terms such as "below", "under", "beneath", "above", "on", "over", etc., may be used herein to describe the relationships of an element or a feature with other elements or features shown in the drawings. It should be understood that the terms of spatial relations are intended to include other different orientations in use or operation in addition to the orientation of the elements or features shown in the drawings. For example, if the drawings are placed upside down, the element or feature which was "above" or "over" other elements or features will be "below" or "under" other elements or features. Thus, the exemplary terms "below" and "beneath" may cover the meanings of "above" or "below". The element or feature can also be positioned in other different ways (e.g., rotating 90 degrees or at other orientations), and the spatial relation terms used herein can be correspondingly interpreted.

The terms used herein are for the purpose of describing particular embodiments only and is not intended to limit the present application. As used herein, the singular forms with "a", "an", "the", or "said" are intended to include the plural forms as well, unless the context clearly indicates otherwise. It should also be understood that the terms "consists of" and/or "comprising", when used in the present application, identify the presence of the stated features, integers, steps, operations, elements and/or parts, but do not exclude presence or addition of one or more other features, integers, steps, operations, elements, parts and/or groups. As used herein, the term "and/or" means that any one of the listed items can be employed by itself or any combination of two or more of the listed items can be employed.

The embodiments of the present application are described herein with reference to cross-sectional views of idealized embodiments (and intermediate structures) of the present application. It can be expected that some variations of the shown shapes may exist due to, for example, manufacturing techniques and/or engineering tolerances. Thus, embodiments of the present application should not be limited to the particular shapes of the regions shown herein but include deviations in shapes due to, for example, manufacturing. The regions shown in the drawings are schematic in nature, and their shapes are not intended to be the actual shapes of the regions of the device or limit the scope of the present application.

An embodiment of the present disclosure provides a solar cell, which includes a substrate, a first emitter, a second emitter, an insulating spacing structure, a first electrode, and a second electrode.

The substrate includes a front surface and a back surface opposite to each other. The first emitter and the second emitter are disposed on the back surface of the substrate. The doping type of the first emitter is a first doping type. The doping type of the second emitter is a second doping type opposite to the first doping type. The first electrode is disposed on a side of the first emitter away from the substrate, and the first electrode is electrically connected to the first emitter. The second electrode is disposed on a side of the second emitter away from the substrate, and the second electrode is electrically connected to the second emitter.

The insulating spacing structure is disposed between the first emitter and the second emitter, and the first emitter and the second emitter are spaced from each other by the insulating spacing structure.

The embodiment of the solar cell provided in the present application includes the first emitter and the second emitter disposed on the back surface of the substrate, and further includes the insulating spacing structure. The first emitter and the second emitter are spaced by the insulating spacing structure. The solar cell can effectively separate the first emitter from the second emitter by introducing the insulating spacing structure, avoiding the recombination of carriers on the interface between the first emitter and the second emitter, thus effectively reducing the reverse leakage of the solar cell and improving the efficiency of the solar cell.

Figure 2:
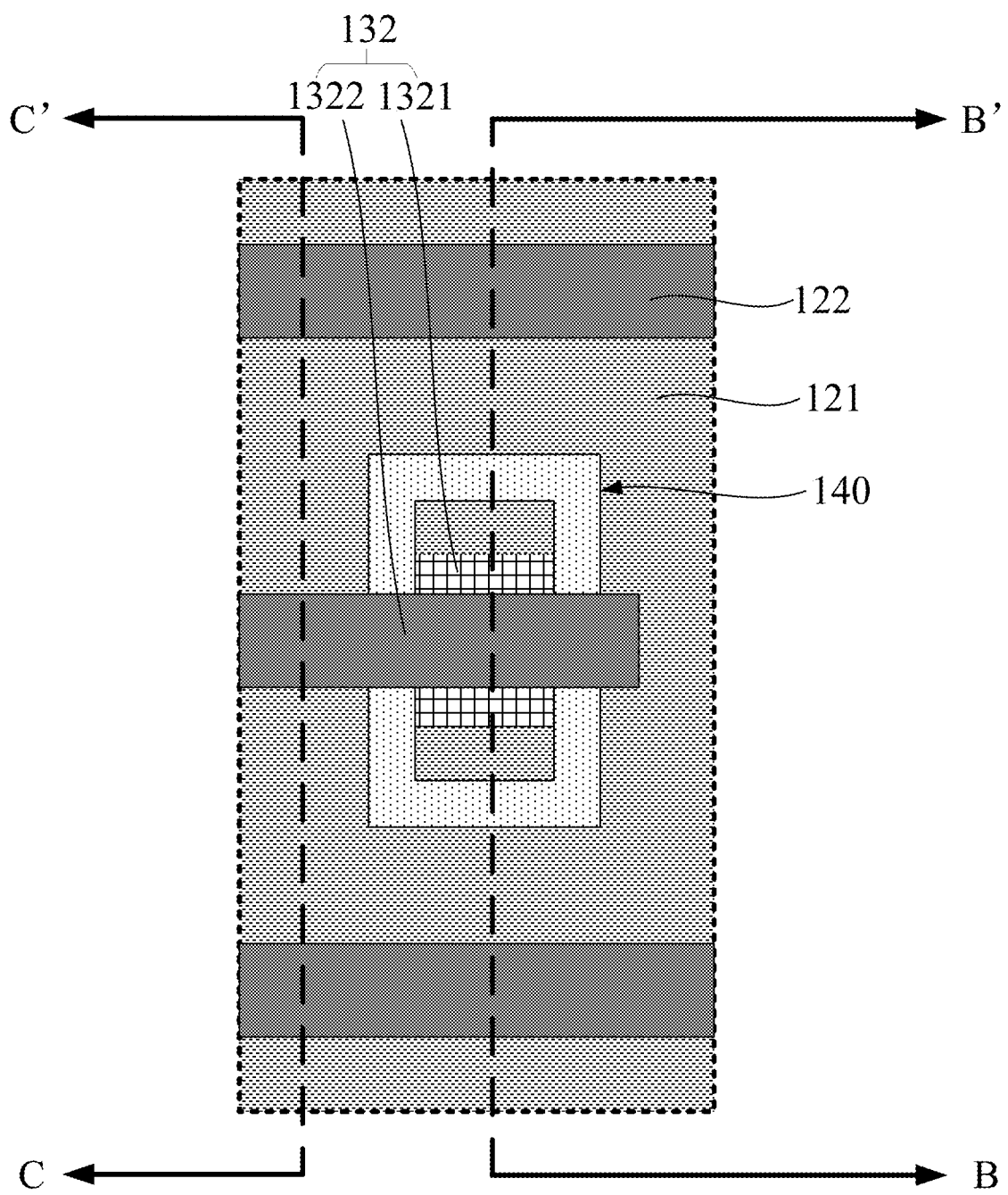
FIG. 2 is an enlarged schematic view of a region A in FIG. 1.
Figure 3:
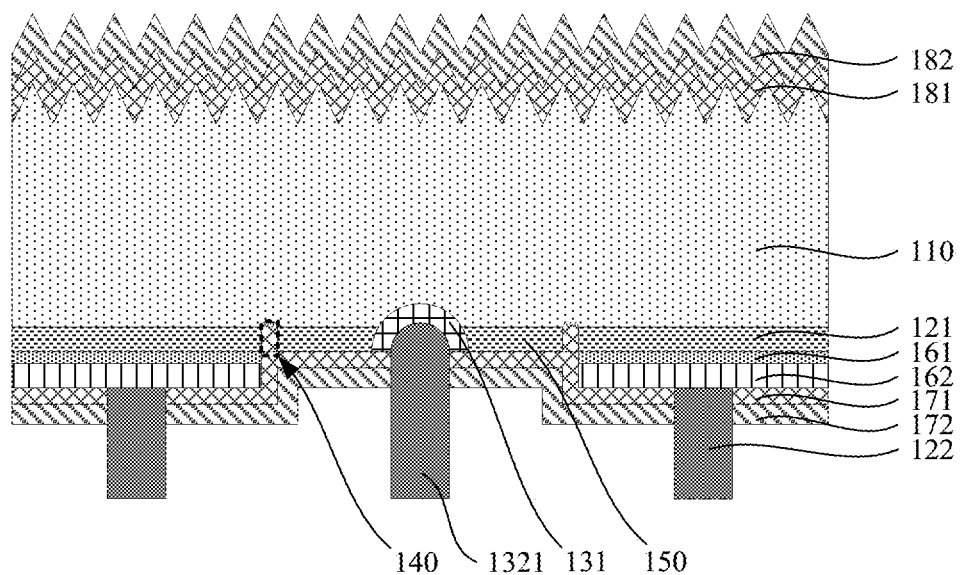
FIG. 3 is a schematic cross-sectional view along a line B-B' in FIG. 2.
Figure 5:
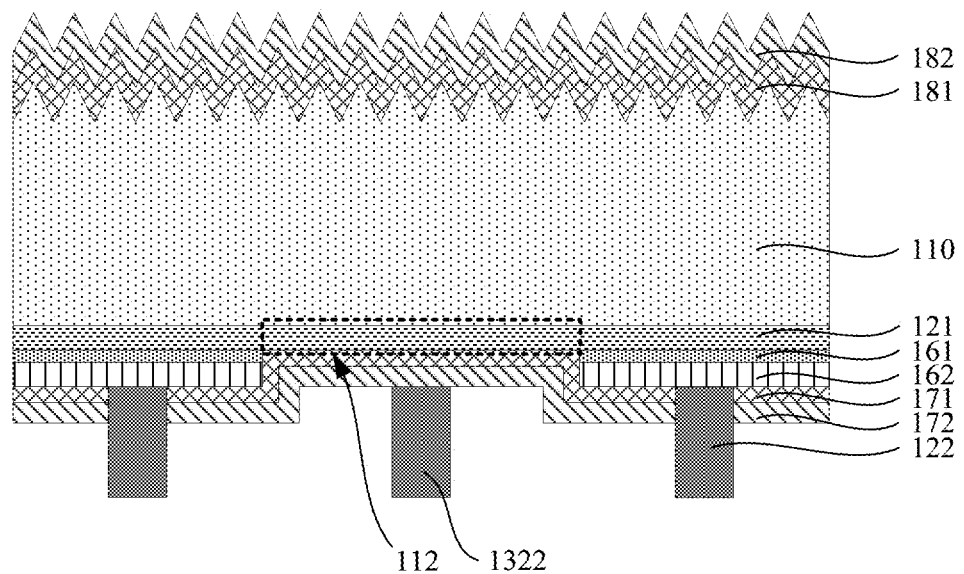
FIG. 5 is a schematic cross-sectional view along a line C-C' in FIG. 2.

In order to facilitate understanding the structure of the above-described solar cell, FIG. 1 provides a schematic structural view of a back side of a solar cell. FIG. 2 shows an enlarged schematic view of a region A in FIG. 1. FIG. 3 shows a schematic cross-sectional view along a line B-B' in FIG. 2. FIG. 5 shows a schematic cross-sectional view along a line C-C' in FIG. 2. In FIG. 1, a first back passivation layer 171, a second back passivation layer 172, a polysilicon layer 162, and a tunnel oxide layer 161 which are shown in FIG. 3 are omitted, so as to show a first emitter 121, a second emitter 131, and an insulating spacing structure 140.

Referring to FIG. 1 and FIG. 2, the solar cell includes a substrate 110, a first emitter 121, a second emitter 131, an insulating spacing structure 140, a first electrode 122, and a second electrode 132.

The substrate 110 includes a front surface and a back surface opposite to each other. In the structure shown in FIG. 3, the upper surface of the substrate 110 is the front surface, and the lower surface is the back surface. The first emitter 121, the second emitter 131, the first electrode 122, and the second electrode 132 are all disposed on the back surface of the substrate 110.

Referring to FIG. 2, the first emitter 121 and the second emitter 131 are both disposed on the back surface of the substrate 110. The first emitter 121 is of a first doping type. The second emitter 131 is of a second doping type opposite to the first doping type. The first emitter 121 is configured to conduct the charge carriers corresponding to the first doping type (e.g., one of electrons or holes) to the first electrode 122, and the second emitter 131 is configured to conduct the charge carriers corresponding to the second doping type (e.g., the other of electrons or holes) to the second electrode 132. It can be understood that the first doping type can be one of P-type or N-type, and the second doping type can be the other of P-type or N-type. The first doping type and the second doping type can be prepared by doping different elements. For example, the first doping type is N-type, and the second doping type is P-type. The first emitter 121 can be an N-type doped semiconductor, and the second emitter 131 can be a P-type doped semiconductor. The doping element for N-type doping can be a Group V element, such as phosphorus. The P-type doping element can be a Group III element, such as one or more of boron, aluminum, or gallium.

The conducting type of the substrate 110 can be the same as that of the second emitter 131, and that is, the doping type of the substrate 110 is the second doping type. Further, the doping concentration of the second emitter 131 can be higher than that of the substrate 110.

The first electrode 122 is disposed on the side of the first emitter 121 away from the substrate 110, and is electrically connected to the first emitter 121. The second electrode 132 is disposed on the side of the second emitter 131 away from the substrate 110, and is electrically connected to the second emitter 131. It can be understood that the first electrode 122 is electrically connected to the first emitter 121 in a manner that the first electrode 122 is in direct contact with the first emitter 121, or that another intermediate layer through which charge carriers can pass is provided between the first electrode 122 and the first emitter 121. The second electrode 132 is electrically connected to the second emitter 131 in a manner that the second electrode 132 is in direct contact with the second emitter 131, or that another intermediate layer through which charge carriers can pass is provided between the second electrode 132 and the second emitter 131.

Referring to FIG. 2, in some examples of the present embodiment, the insulating spacing structure 140 can be in an annular shape. It can be understood that the annular shape refers to a cross-section of the insulating spacing structure 140 being annular shaped, and the three-dimensional shape of the insulating spacing structure 140 can be an annular column. The annular shape can also be understood as a closed cylindrical or tubular shape. Thus, an inner area and an outer area can be defined by the insulating spacing structure 140. The outer area refers to the area outside the annular insulating spacing structure 140, and the inner area refers to the area inside and surrounded by the annular insulating spacing structure 140.

The first emitter 121 is disposed in the outer area defined by the insulating spacing structure 140, and the second emitter 131 is disposed in the inner area defined by the insulating spacing structure 140, so that the first emitter 121 is spaced from the second emitter 131 by the insulating spacing structure 140. The insulating spacing structure 140 insulates and separates the inner area from the outer area. In some embodiments, the insulating spacing structure 140 can be an insulating groove that separates the inner area from the outer area, or can be an insulating material that separates the inner area from the outer area, or can be an insulating groove filled with an insulating material that separates the inner area from the outer area.

In some examples of the present embodiment, referring to FIG. 3, the insulating spacing structure 140 includes an annular spacing groove 141, and the spacing groove 141 is defined between the first emitter 121 and the second emitter 131, thereby electrically insulating the first emitter 121 from the second emitter 131.

The spacing groove 141 can be formed by etching, e.g., laser etching. In the etching step, the first doped layer 1201 can be etched until the substrate 110 is exposed, thereby electrically insulating the first emitter 121 from the second emitter 131. In this case, the bottom wall of the spacing groove 141 is the exposed surface of the substrate 110. In the actual preparation process, the substrate 110 is cleaned after the etching step for forming the spacing groove 141. This process also textures the surface of the substrate 110 to form a textured structure in the bottom wall of the spacing groove 141, which adversely affects the light absorption efficiency on the front side of the substrate 110. In some examples of the present embodiment, on the condition that the surface of the substrate 110 forming the bottom wall of the groove has the textured structure, the groove width of the spacing groove 141 is equal to or smaller than 100 μm. By setting the width of the spacing groove 141 to be equal to or smaller than 100 μm, the negative effect of the textured structure of the bottom wall of the spacing groove 141 on the light absorption efficiency can be reduced as much as possible, and the requirement of processing speed in the actual preparation process can be met as well.

Further, in some examples of the present embodiment, the groove width of the spacing groove 141 is in a range from 1 μm to 100 μm, in order to ensure effective insulation of the spacing groove 141 while reducing the negative effect of the textured structure of the bottom wall of the spacing groove 141 on the light absorption efficiency. In some examples, the groove width of the spacing groove 141 is in a range from 10 μm to 50 μm. Further optionally, the groove width of the spacing groove 141 is in a range from 15 μm to 30 μm.

In some examples of the present embodiment, the insulating spacing structure 140, the first emitter 121, and the second emitter 131 are disposed in the same layer. The spacing groove 141 further includes a cylindrical outer sidewall and a cylindrical inner sidewall both connected to the bottom wall. In some examples, the first emitter 121 participates in forming the cylindrical outer sidewall of the spacing groove 141, and the second emitter 131 participates in forming the cylindrical inner sidewall of the spacing groove 141.

In some examples of the present embodiment, the solar cell further includes a remaining doped portion 150. The material and doping type of the remaining doped portion 150 are the same as those of the first emitter 121. The remaining doped portion 150 is disposed in the inner area surrounded by the insulating spacing structure 140, and is disposed between the second emitter 131 and the insulating spacing structure 140.

In some examples of the present embodiment, the solar cell further includes a passivation contact structure. The passivation contact structure includes a tunnel oxide layer 161 and a polysilicon layer 162. The tunnel oxide layer 161 and the polysilicon layer 162 are sequentially stacked on the surface of the first emitter 121 at the side away from the substrate 110. The polysilicon layer 162 is of the first doping type. The passivation contact structure is configured to reduce carrier recombination due to the contact between the first emitter 121 and the first electrode 122, thereby improving the efficiency.

The tunnel oxide layer 161 shall be relatively thin in thickness, so that the carriers can pass through the tunnel oxide layer 161 and be transported into the polysilicon layer 162. In some examples of the present embodiment, the thickness of the tunnel oxide layer 161 is in a range from 1 nm to 2 nm.

In some examples of the present embodiment, the thickness of the polysilicon layer 162 is in a range from 10 nm to 300 nm.

Referring to FIG. 1, in some examples of the present embodiment, the back surface of the substrate 110 includes a first region 111 and a second region 112 outside the first region 111. In FIG. 1, the region indicated in the dotted line block is the second region 112, and the region indicated outside the dotted line block is the first region 111. The passivation contact structure is disposed in the first region 111 and covers the first region 111 of the back surface of the substrate 110, and the insulating spacing structure 140 is disposed in the second region 112 of the back surface of the substrate 110. In an actual preparation process, the passivation contact structure on the second region 112 can be removed by etching, so that the passivation contact structure only covers the first region 111. Further, the inner area surrounded by the insulating spacing structure 140 can also be located in the second region 112, while the second emitter 131 is also located in the second region 112.

Referring to FIG. 1, in some examples of the present embodiment, the second region 112 is a continuous region located in the first region 111.

Referring to FIG. 1 and FIG. 2, there are a plurality of insulating spacing structures 140 and a plurality of second emitters 131. The second electrode 132 includes a connecting portion 1322 and a plurality of electrode portions 1321. The plurality of electrode portions 1321 are respectively in contact with the plurality of second emitters 131. The electrode portions 1321 are respectively disposed in the inner areas defined by the plurality of insulating spacing structures 140. The connecting portion 1322 is connected to the electrode portions 1321. The plurality of electrode portions 1321 and the connecting portion 1322 are all disposed in the second region 112.

It can be understood that the electrode portion 1321 of the second electrode 132 is shown in FIG. 3, and the electrode portion 1321 is in direct contact with the second emitter 131. FIG. 5 shows a connecting portion 1322 of the second electrode 132, and the connecting portion 1322 is configured to electrically connect adjacent electrode portions 1321.

Referring to FIG. 3 and FIG. 5, in some examples of the present embodiment, the front surface of the substrate 110 has a textured structure to obtain higher light absorption efficiency, while the bottom wall of the spacing groove 141 also has a textured structure. The textured structures of the front surface and the back surface of the substrate 110 can be formed simultaneously in a same step, or can be formed separately in different steps.

Figure 4:
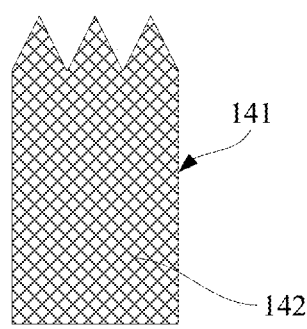
FIG. 4 is an enlarged schematic view of an insulating spacing structure in FIG. 3.

Referring to FIG. 3 and FIG. 4, in some examples of the present embodiment, the insulating spacing structure 140 further includes an insulating member 142 disposed in the spacing groove 141. Further, the solar cell can include an insulating first back passivation layer 171. The first back passivation layer 171 can be disposed on a side of the first emitter 121 away from the substrate 110 and on a side of the second emitter 131 away from the substrate 110. Furthermore, the first back passivation layer 171 can be integrated with the insulating member 142.

The first back passivation layer 171 is configured to passivate the surface of the solar cell. The passivation layer is usually disposed on the surface of the emitter layer to reduce the carrier recombination at the surface. In the present embodiment, the first back passivation layer 171 and the insulating member 142 are integrated with each other, which not only simplifies the preparation process, but also reduces the carrier recombination at the interface between the first emitter 121 and the second emitter 131 by using the same material as that of the passivation layer to form the insulating member 142.

In some examples of the present embodiment, the solar cell can further include a second back passivation layer 172. The second back passivation layer 172 is disposed on the side of the first back passivation layer 171 away from the substrate 110. The second back passivation layer 172 is in contact with the first back passivation layer 171. The second back passivation layer 172 and the first back passivation layer 171 form a passivation layer stack to further improve the passivation effect.

In some examples of the present embodiment, the materials of the first back passivation layer 171 and the second back passivation layer 172 are each independently selected from one or more of silicon nitride, aluminum oxide, titanium oxide, silicon oxide or silicon oxynitride. The material of the first back passivation layer 171 can be different from that of the second back passivation layer 172.

Referring to FIG. 3 and FIG. 5, in some examples of the present embodiment, the solar cell can further include a first front passivation layer 181 and a second front passivation layer 182. The first front passivation layer 181 and the second front passivation layer 182 are sequentially stacked on the front surface of the substrate 110. The first front passivation layer 181 and the second front passivation layer 182 form a passivation layer stack to further improve the passivation effect.

In some examples of the present embodiment, the materials of the first front passivation layer 181 and the second front passivation layer 182 are each independently selected from one or more of silicon nitride, aluminum oxide, titanium oxide, silicon oxide, or silicon oxynitride.

Referring to FIG. 1 and FIG. 3, in some examples of the present embodiment, a part of the outer edge of the insulating spacing structure 140 can be in alignment with the edge of the second region 112.

Referring to FIG. 1 and FIG. 3, in some examples of the present embodiment, a remaining doped portion 150 can be disposed in the inner area surrounded by the insulating spacing structure 140. The remaining doped portion 150 is located between the second emitter 131 and the insulating spacing structure 140. The material and doping type of the remaining doped portion 150 can be the same as those of the first emitter 121.

Figure 6:
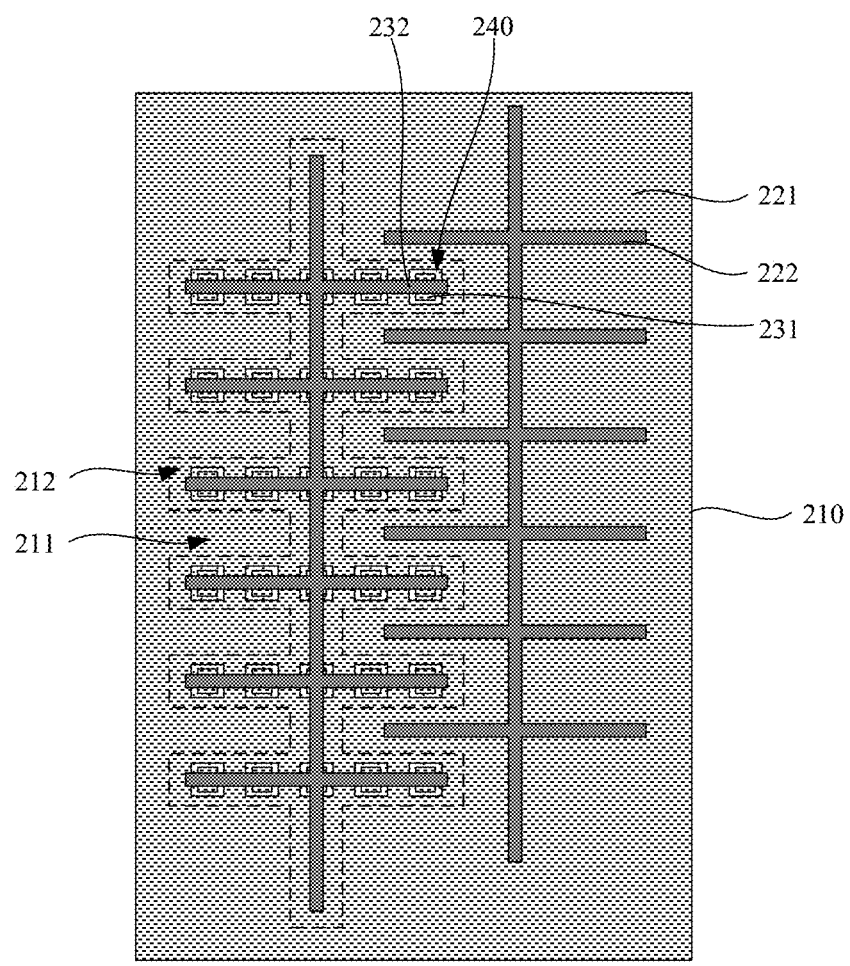
FIG. 6 is a schematic structural view of a back side of a solar cell according to another embodiment of the present application.

FIG. 6 is a schematic structural view of a back side of a solar cell according to another embodiment of the present application. Referring to FIG. 6, the solar cell includes a substrate 210, a first emitter 221, a second emitter 231, a first electrode 222, a second electrode 232, and an insulating spacing structure 240. The back surface of the substrate 210 includes a first region 211 and a second region 212. The relative positional relationships among the various components are similar to those of the solar cell in FIG. 1, and are not repeated herein. The difference from the solar cell shown in FIG. 1 is that only the second emitter 231 is disposed in the inner area surrounded by the insulating spacing structure 240, without a remaining doped portion. In this case, the cylindrical inner sidewall of the insulating spacing structure 240 is in close contact with the edge of the second emitter 231.

It can be understood that, in other embodiments, the cylindrical outer sidewall of the insulating spacing structure 240 can be located between the edge of the second region 212 and the edge of the second emitter 231.

Further, an embodiment of the present disclosure provides a method for preparing the above-described solar cell, and the method including the following steps of:

providing a substrate including a front surface and a back surface opposite to each other;

forming a first doped layer on the back surface of the substrate, the first doped layer being in contact with the substrate and covering the substrate, and a doping type of the first doped layer being a first doping type;

forming an annular insulating spacing structure in the first doped layer, thereby the portion of the first doped layer located outside the annular insulating spacing structure being the first emitter;

forming a second emitter in the inner area surrounded by the annular insulating spacing structure, and the second emitter being in contact with the substrate and being of a second doping type; and forming a first electrode electrically connected to the first emitter, and forming a second electrode electrically connected to the second emitter.

In the embodiment of the method for preparing the solar cell, the annular insulating spacing structure is formed in the first doped layer, and then the second emitter is formed in the inner area surrounded by the annular insulating spacing structure, so that the first emitter and the second emitter are insulated and spaced from each other, avoiding carrier recombination at the interface between the first emitter and the second emitter to reduce leakage current. Moreover, by forming the insulating spacing structure, the first doped layer in the inner area surrounded by the insulating spacing structure can be used as a protective layer to prevent texturing the substrate in the inner area, thereby reducing the adversely effect of forming the insulating spacing structure on the light absorption efficiency of the solar cell.

In some examples of the present embodiment, the step of forming the insulating spacing structure includes a step of etching the first doped layer to form an annular spacing groove penetrating through the first doped layer, wherein the insulating spacing structure includes the spacing groove.

In some examples of the present embodiment, the method further includes cleaning and texturing the substrate by placing the substrate in a texturizing agent after forming the spacing groove, thereby forming a textured structure in the front surface of the substrate and the bottom wall of the spacing groove.

In some examples of the present embodiment, before forming the second emitter, the method further includes a step of forming an insulating passivation material on the back side of the substrate, wherein the passivation material located in the spacing groove forms an insulating member, and the insulating spacing structure includes the insulating member; the passivation material located on the first doped layer forms the back passivation layer.

In some examples of the present embodiment, the step of forming the first doped layer includes: sequentially forming a tunnel oxide layer and a silicon material layer on the back side of the substrate; diffusing a doping element into the silicon material layer; and annealing the silicon material layer to form a polysilicon layer having a first doping type. In the annealing step, the doping element is diffused into the substrate material, thereby forming the first doped layer that covers the substrate.

In some examples of the present embodiment, the back surface of the substrate includes a first region and a second region outside the first region. The method further includes removing the polysilicon layer and the tunnel oxide layer in the second region when the polysilicon layer is formed.

Figure 7:
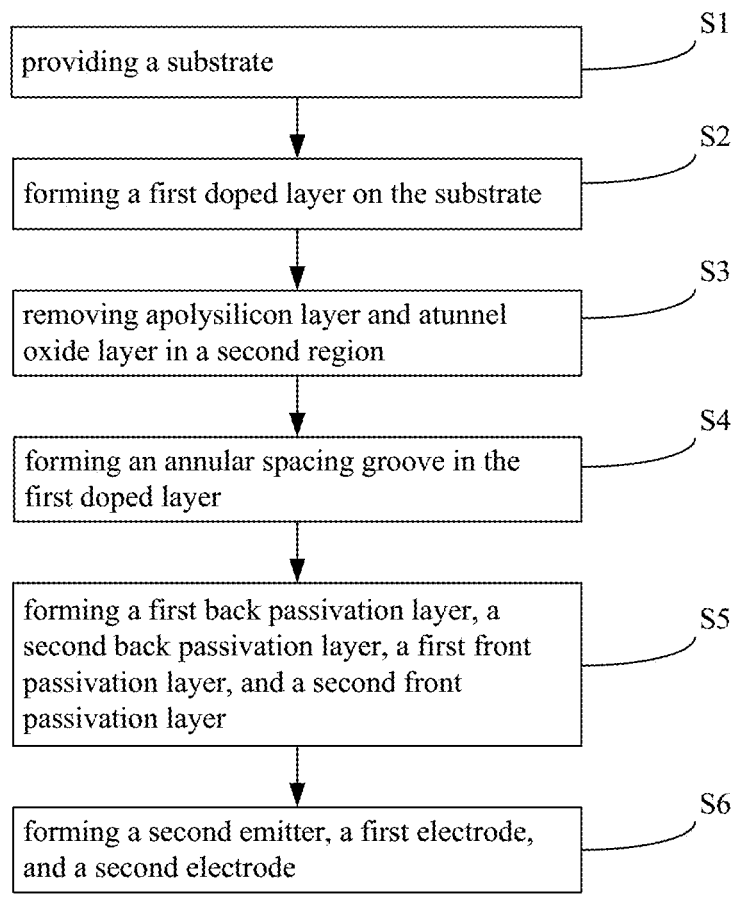
FIG. 7 is a flow chart showing a method for preparing a solar cell according to an embodiment of the present application.

Further, FIG. 7 shows a flow chart of the method for preparing the solar cell in FIG. 1. Referring to FIG. 7, the embodiment of the method for preparing the solar cell includes steps S1 to S6.

In step S1, a substrate is provided.

Figure 8:
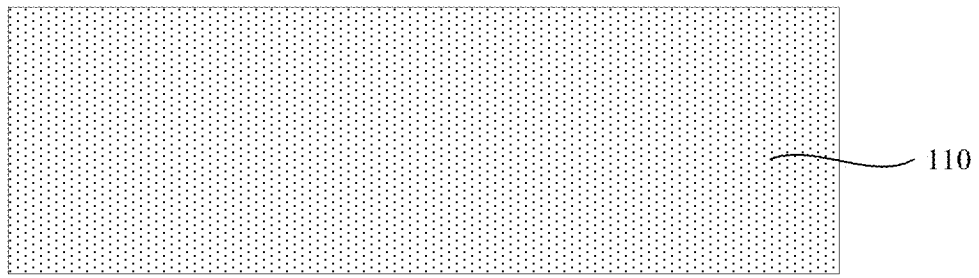
FIG. 8 is a schematic structural view of a substrate according to an embodiment of the present application.

Referring to FIG. 8, the substrate 110 includes a front surface and a back surface opposite to each other. The back surface of the substrate 110 is located at the lower side of the substrate 110. The material of the substrate 110 can be silicon, such as single-crystal silicon. The doping type of the substrate 110 can be a second doping type. For example, the substrate 110 is made of P-type doped silicon.

In some examples of the present embodiment, the method further includes a step of texturizing the front surface of the substrate 110. The step of texturizing the front surface of the substrate 110 can include: placing the substrate 110 in a texturizing agent to form a textured structure in the front surface of the substrate 110. The textured structure can be pyramid-shaped.

In some examples of the present embodiment, the method further includes a step of polishing the back surface of the substrate 110. A chemical polishing agent can be used for polishing.

The back surface of the substrate 110 includes a first region 111 and a second region 112. The second region 112 corresponds to the part to be removed in the passivation contact structure subsequently prepared, and the first region 111 is located outside the second region 112.

In step S2, a first doped layer is formed on the substrate.

The first doped layer 1201 can be formed using the same material as that of the substrate 110, or using a new material deposited on the surface of the substrate 110. In some examples of the present embodiment, the first doped layer 1201 can be formed by doping the back surface of the substrate 110. For example, the doping type of the first doped layer 1201 is N-type, and the first doped layer 1201 can be formed by diffusing phosphorus into the back surface of the substrate 110.

In some examples of the present embodiment, the step of forming the first doped layer 1201 can include: sequentially forming a tunnel oxide layer 161 and a silicon material layer on the back surface of the substrate 110; diffusing a doping element into the silicon material layer; and annealing the silicon material layer to form a polysilicon layer 162 having a first doping type. It can be understood that during the doping element diffusion and annealing, the doping element also diffuses into the material of the substrate 110 to form the first emitter 121 covering the substrate 110. In this way, not only the first emitter 121 with the first doping type but also a passivation contact structure is formed on the substrate 110, reducing the interface recombination and further improving the efficiency of the solar cell.

Figure 9:
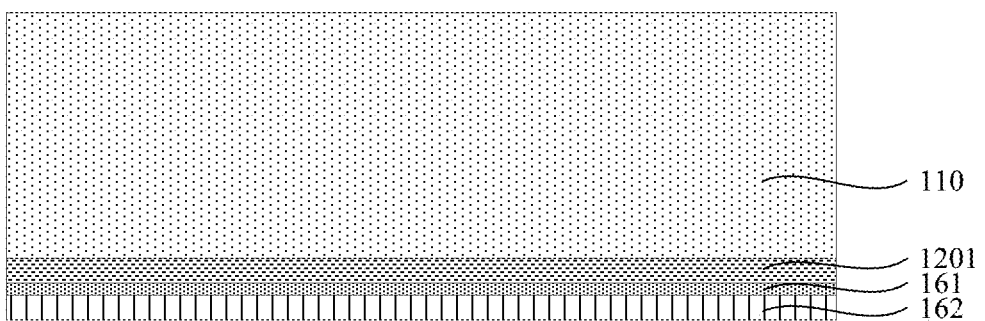
FIG. 9 is a schematic structural view of forming a first doped layer, a tunnel oxide layer, and a polysilicon layer on the basis of the structure shown in FIG. 8, according to an embodiment of the present application.

FIG. 9 shows a schematic structural view of further forming a first doped layer 1201, a tunnel oxide layer 161, and a polysilicon layer 162 on the basis of the structure shown in FIG. 8. Referring to FIG. 9, the first doped layer 1201 covers the back surface of the substrate 110. The first doped layer 1201 is used to form the first emitter 121 in the subsequent preparation process. It can be understood that only a part of the first doped layer 1201 is used as the first emitter 121, and the other part of the first doped layer 1201 is removed in the subsequent preparation process. Optionally, some part of the first doped layer 1201 is not removed but remains as a non-active part.

In some examples of the present embodiment, when the first doped layer 1201 is formed, the method further includes a step of removing the wraparound material on the lateral surface and the front surface of the substrate 110.

Referring to FIG. 9, the passivation contact structure includes the stacked tunnel oxide layer 161 and polysilicon layer 162. In some examples of the present embodiment, the step of forming the passivation contact structure includes: sequentially forming the tunnel oxide layer 161 and the polysilicon layer 162 on the first doped layer 1201, wherein the doping type of the polysilicon layer 162 is the first doping type.

The tunnel oxide layer 161 can be formed by partially oxidizing the first doped layer 1201, or can be formed by depositing the tunnel oxide layer 161 on the first doped layer 1201. In some examples of the present embodiment, the tunnel oxide layer 161 is formed on the first doped layer 1201 by chemical vapor deposition.

The polysilicon layer 162 can be formed by deposition. Further, the polysilicon layer 162 can be directly doped during the deposition process, or can be doped when the polysilicon layer 162 is formed. In some examples of the present embodiment, an amorphous silicon layer is first deposited on the surface of the tunnel oxide layer 161 by chemical vapor deposition, then the amorphous silicon layer is doped, and then the amorphous silicon layer is annealed to obtain the polysilicon layer 162 with the first doping type.

It can be understood that in step S2, the tunnel oxide layer 161 and the polysilicon layer 162 both cover the entire first doped layer 1201.

In step S3, the polysilicon layer and the tunnel oxide layer in the second region are removed.

Figure 10:
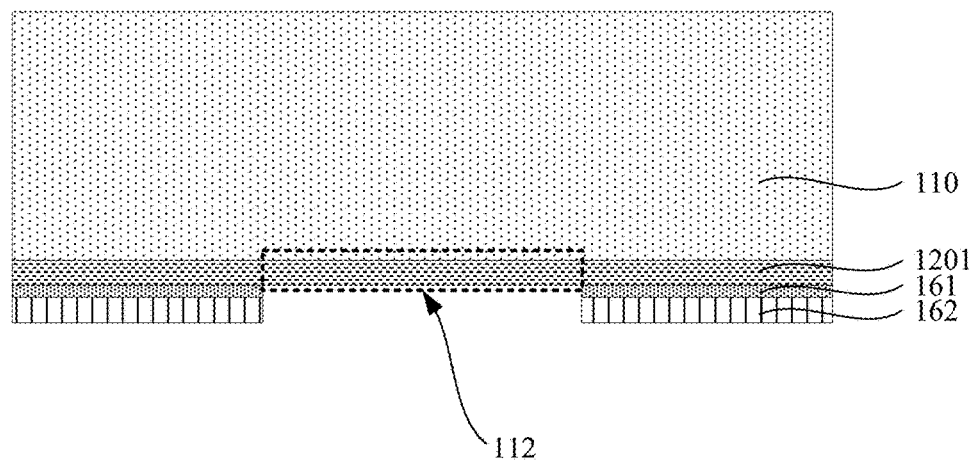
FIG. 10 is a schematic structural view of removing a part of the polysilicon layer and a part of the tunnel oxide layer on the basis of the structure shown in FIG. 9, according to an embodiment of the present application.

FIG. 10 shows a schematic structural view of removing a part of the polysilicon layer and a part of the tunnel oxide layer on the basis of the structure shown in FIG. 9. Referring to FIG. 10, the part of the polysilicon layer 162 and the part of the tunnel oxide layer 161 located in the second region 112 are removed. It can be understood that there is no polysilicon layer 162 or tunnel oxide layer 161 in the second region 112.

The polysilicon layer 162 and the tunnel oxide layer 161 can be removed by etching. The specific way of etching can be selected from wet etching or laser etching.

In some examples of the present embodiment, the polysilicon layer 162 and the tunnel oxide layer 161 are removed by laser etching.

It can be understood that after removing the polysilicon layer 162 and the tunnel oxide layer 161 in the second region 112, a part of the first doped layer 1201 in the second region 112 is exposed, and the first doped layer 1201 can function as a protective layer for the substrate 110.

In step S4, an annular spacing groove is formed in the first doped layer.

In some examples of the present embodiment, the step of forming the spacing groove 141 includes a step of removing a part of the first doped layer 1201 to form the annular spacing groove 141.

Figure 11:
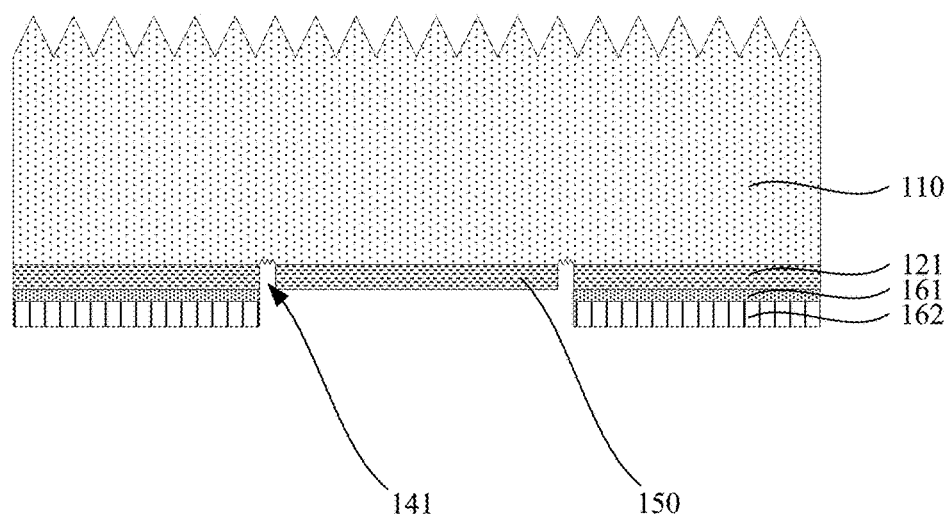
FIG. 11 is a schematic structural view of forming a spacing groove on the basis of the structure shown in FIG. 10, according to an embodiment of the present application.

FIG. 11 shows a schematic structural view of forming a spacing groove 141 on the basis of the structure shown in FIG. 10. Referring to FIG. 11, a part of the first doped layer 1201 in the second region 112 is removed to form the annular spacing groove 141. The first doped layer 1201 located in the outer area outside the spacing groove 141 functions as the first emitter 121, while the first doped layer 1201 located in the inner area surrounded by the spacing groove 141 is remained and functions as a remaining doped portion 150. The first emitter 121 is insulated and spaced from the remaining doped portion 150.

In some examples of the present embodiment, the spacing groove 141 penetrates through the first doped layer 1201, so that the bottom of the spacing groove 141 is the substrate 110.

In some examples of the present embodiment, the first doped layer 1201 is removed by laser etching.

In some examples of the present embodiment, in the step of forming the annular spacing groove 141, the groove width of the spacing groove 141 is controlled to be smaller than or equal to 100 μm. Further, the groove width of the spacing groove 141 can be controlled in a range from 1 μm to 100 μm. In some examples, the groove width of the spacing groove 141 is in a range from 10 μm to 50 μm. Further optionally, the groove width of the spacing groove 141 is in a range from 15 μm to 30 μm.

It can be understood that when the spacing groove 141 is formed by laser etching, the surface of the substrate 110 still has residual materials, so the substrate 110 needs to be chemically cleaned.

In some examples of the present embodiment, the substrate 110 is chemically cleaned with a texturing agent, so as to form a textured structure in the front surface of the substrate 110 while cleaning the substrate 110, which simplifies the preparation process. It can be understood that the substrate 110 in the inner area surrounded by the spacing groove 141 is covered by the remaining doped portion 150, and thus only the part of the back surface of the substrate 110 exposed through the spacing groove 141 will be formed with a textured structure.

It can be understood that if not forming the annular spacing groove 141 but removing all the first doped layer 1201 in the inner area surrounded by the spacing groove 141, the entire area (i.e., the second region 112) of the substrate 110 which is not covered by the remaining doped portion 150 will be formed with a textured structure, which will significantly reduce the light absorption efficiency of the substrate 110, resulting in low efficiency of the solar cell.

In step S5, a first back passivation layer, a second back passivation layer, a first front passivation layer, and a second front passivation layer are formed.

Figure 12:
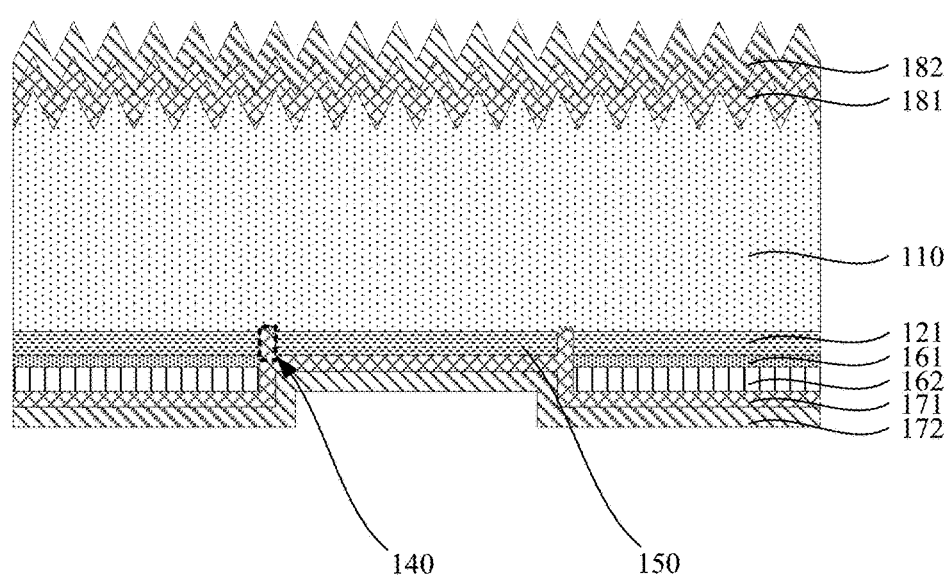
FIG. 12 is a schematic structural view of forming a passivation stack on the basis of the structure shown in FIG. 11, according to an embodiment of the present application.

FIG. 12 shows a schematic structural view of forming a passivation stack on the basis of the structure shown in FIG. 11. Referring to FIG. 12, the first back passivation layer 171 covers the back side of the substrate 110. Further, when forming the first back passivation layer 171, the passivation material is also filled in the spacing groove 141 to form the insulating member 142. It can be understood that the passivation material can be selected from insulating materials to prevent electrical conduction between the first emitter 121 and the remaining doped portion 150.

In some examples of the present embodiment, the first back passivation layer 171 and the first front passivation layer 181 are made of the same material. During the preparation process, the first back passivation layer 171 and the first front passivation layer 181 can be formed on the front side and the back side of the substrate 110 at the same time.

In some examples of the present embodiment, after forming the first back passivation layer 171 and the first front passivation layer 181, the second back passivation layer 172 and the second front passivation layer 182 are then formed.

In some examples of the present embodiment, the second back passivation layer 172 and the second front passivation layer 182 are made of the same material. During the preparation process, the second back passivation layer 172 and the second front passivation layer 182 can be formed on the front side and the back side of the substrate 110 at the same time.

In step S6, a second emitter, a first electrode, and a second electrode are formed.

It can be understood that after step S6, the solar cell with the cross-sectional structure as shown in FIG. 3 can be formed. The first electrode 122 passes through the first back passivation layer 171 and the second back passivation layer 172, and comes into contact with the polysilicon layer 162. The first electrode 122 is electrically connected to the first emitter 121 through the tunnel oxide layer 161 and the polysilicon layer 162.

In some examples of the present embodiment, in the step of forming the first electrode 122, the tunnel oxide layer 161 and the polysilicon layer 162 are etched first to form a first connection hole, and then a conductive material is filled in the first connection hole to form the first electrode 122.

In some examples of the present embodiment, the material of the first electrode 122 can be one or more of silver or copper.

In some examples of the present embodiment, the second emitter 131 can be formed by co-sintering the material of the second electrode 132 and the material of the substrate 110.

The second electrode 132 passes through the first back passivation layer 171 and the second back passivation layer 172, and the second electrode 132 is in contact with the second emitter 131.

In some examples of the present embodiment, in the step of forming the second electrode 132, the tunnel oxide layer 161 and the polysilicon layer 162 can be etched first to form a second connection hole, then the material of the second electrode 132 is filled in the second connection hole, and then the structure is sintered to form the second emitter 131 and the second electrode 132.

The material of the second electrode 132 can include aluminum.

The solar cell structure in the embodiment of the present disclosure can be prepared through steps S1 to S6.

In order to facilitate the understanding of the specific implementations and advantages of the solar cell according to the embodiments of the present application, the present application further provides the following examples and comparative examples. The advantages of the solar cell according to the embodiments of the present application will be apparent through the differences between the examples and comparative examples.

Example 1

A P-type single-crystal silicon wafer is used as the substrate, which is alkali polished to remove the surface layer containing mechanical damages and the pollutants on the substrate.

A tunnel oxide layer with a thickness of 2 nm and an amorphous silicon layer with a thickness of 100 nm are deposited on the back side of the substrate. Then the amorphous silicon layer is doped with phosphorus and annealed, so that the amorphous silicon layer is converted into an N-type polysilicon layer and a first doped layer is formed between the tunnel oxide layer and the substrate.

The polysilicon layer and the tunnel oxide layer in the second region are removed by laser etching to expose the first doped layer.

A plurality of annular spacing grooves are formed by laser etching the first doped layer in the second region, and the groove width of the spacing groove is 25 μm. The first doped layer in the outer area outside the annular spacing grooves functions as the first emitter, and the first doped layer in the inner area of the annular spacing grooves forms the remaining doped portion. Then the substrate is cleaned and textured in a texturing agent to form a textured structure in the front surface of the substrate and the back surface of the substrate exposed through the spacing grooves.

Aluminum oxide layers are deposited on both the front and back sides of the substrate as the first front passivation layer and first back passivation layer, and then silicon nitride layers are deposited as the second front passivation layer and second back passivation layer.

By using laser etching, first connection holes are formed at the position corresponding to the first electrodes, exposing a part of the polysilicon layer, and second connection holes are formed at the position corresponding to the second electrodes, exposing a part of the substrate in the second region.

A silver paste is screen-printed on the exposed polysilicon layer, and an aluminum paste is screen-printed on the exposed substrate in the second region, which are both sintered, thereby forming second emitters from the part of the aluminum paste that is in contact with the substrate, forming first electrodes from the silver paste, and forming second electrodes from the aluminum paste.

Example 2

A P-type single-crystal silicon wafer is used as the substrate, which is alkali polished to remove the surface layer containing mechanical damages and the pollutants on the substrate. Then a textured structure is formed in the front surface of the substrate.

A tunnel oxide layer with a thickness of 2 nm and an amorphous silicon layer with a thickness of 100 nm are deposited on the back side of the substrate. Then the amorphous silicon layer is doped with phosphorus and annealed, so that the amorphous silicon layer is converted into an N-type polysilicon layer, and a first doped layer is formed between the tunnel oxide layer and the substrate.

The polysilicon layer and the tunnel oxide layer in the second region are removed by laser etching to expose the first doped layer.

A plurality of annular spacing grooves are formed by laser etching the first doped layer in the second region, and the groove width of the spacing groove is 20 μm. The first doped layer in the outer area outside the annular spacing grooves functions as the first emitter, and the first doped layer in the inner area surrounded by the annular spacing grooves forms the remaining doped portion. Then the substrate is cleaned with a texturing agent.

Aluminum oxide layers are deposited on both the front and back sides of the substrate as the first front passivation layer and first back passivation layer, and then silicon nitride layers are deposited as the second front passivation layer and second back passivation layer.

By using laser etching, first connection holes are formed at the position corresponding to the first electrodes, exposing a part of the polysilicon layer, and second connection holes are formed at the position corresponding to the second electrodes, exposing a part of the substrate in the second region.

A silver paste is screen-printed on the exposed polysilicon layer, and an aluminum paste is screen-printed on the exposed substrate in the second region, which are both sintered, thereby forming second emitters from the part of the aluminum paste that is in contact with the substrate, forming first electrodes from the silver paste, and forming second electrodes from the aluminum paste.

Comparative Example 1

A P-type single-crystal silicon wafer is used as the substrate, which is alkali polished to remove the surface layer containing mechanical damages and the pollutants on the substrate.

The back surface of the substrate is doped with phosphorus to form an N-type first doped layer.

A tunnel oxide layer with a thickness of 2 nm and an amorphous silicon layer with a thickness of 100 nm are deposited on the back side of the substrate. Then the amorphous silicon layer is doped with phosphorus and annealed, so that the amorphous silicon layer is converted into an N-type polysilicon layer.

The polysilicon layer and the tunnel oxide layer in the second region are removed by wet etching.

The substrate is cleaned and textured in a texturing agent to form a textured structure in the front surface of the substrate.

Aluminum oxide layers are deposited on both the front and back sides of the substrate as the first front passivation layer and first back passivation layer, and then silicon nitride layers are deposited as the second front passivation layer and second back passivation layer.

By using laser etching, first connection holes are formed at the position corresponding to the first electrodes, exposing the polysilicon layer in the N region, and second connection holes are formed at the position corresponding to the second electrodes, exposing the substrate in the P region.

A silver paste is screen-printed in the N region, and an aluminum paste is screen-printed in the P region, which are both sintered, thereby forming second emitters from the part of the aluminum paste that is in contact with the substrate, forming first electrodes from the silver paste, and forming second electrode from the aluminum paste.

Comparative Example 2

A P-type single-crystal silicon wafer is used as the substrate, which is alkali polished to remove the surface layer containing mechanical damages and the pollutants on the substrate.

A tunnel oxide layer with a thickness of 2 nm and an amorphous silicon layer with a thickness of 100 nm are deposited on the back side of the substrate. Then the amorphous silicon layer is doped with phosphorus and annealed, so that the amorphous silicon layer is converted into an N-type polysilicon layer and a first doped layer is formed between the tunnel oxide layer and the substrate.

The polysilicon layer and the tunnel oxide layer in the second region are removed by laser etching to expose the first doped layer.

The polysilicon layer, the tunnel oxide layer, and the first doped layer in the entire of the second region are removed by laser etching. Then the substrate is cleaned and textured in a texturing agent to form a textured structure in the front surface of the substrate and the second region of the back surface of the substrate.

Aluminum oxide layers are deposited on both the front and back sides of the substrate as the first front passivation layer and first back passivation layer, and then silicon nitride film layers are deposited as the second front passivation layer and second back passivation layer;

By using laser etching, first connection holes are formed at the position corresponding to the first electrodes, exposing a part of the polysilicon layer, and second connection holes are formed at the position corresponding to the second electrodes, exposing a part of the substrate in the second region.

A silver paste is screen-printed on the exposed polysilicon layer, and an aluminum paste is screen-printed on the exposed substrate in the second region, which are both sintered, thereby forming second emitters from the part of the aluminum paste that is in contact with the substrate, forming first electrodes from the silver paste, and forming second electrodes from the aluminum paste.

Tests: The efficiency and the reverse leakage current at a reverse voltage of 1.1 V of the solar cells in Examples 1 to 2 and Comparative Examples 1 to 2 are tested. The results can be seen in Table 1. In the column for reverse leakage current, the reverse leakage currents are evaluated by using two critical values. "<1" means that the reverse leakage current of the solar cell is smaller than 1 A, indicating that the reverse leakage current is suppressed. ">5" means that the reverse leakage current of the solar cell is larger than 5 A, indicating that the reverse leakage current is relatively serious.

TABLE 1

|  | Efficiency | Reverse Leakage Current (A) |
| --- | --- | --- |
| Example 1 | 24.50% | <1 |
| Example 2 | 24.55% | <1 |
| Comparative Example 1 | 24.50% | >5 |
| Comparative Example 2 | 24.30% | <1 |

Referring to Table 1, compared with Example 1 and Example 2, the reverse leakage current of the solar cell in Comparative Example 1 is significantly larger. The main reason is that no spacing groove or insulating spacing structure is formed between the first emitter and the second emitter in Comparative Example 1, which results in a relatively high leakage current. In Comparative Example 2, although the reverse leakage current is reduced, the efficiency is also significantly reduced, which is mainly due to the completely removal of the first doped layer from the second region followed by the texturing step, so that the entire second region has a textured structure, leading to the reduced efficiency.

The above embodiments are for illustrative purposes only and are not meant to limit the present application.

It should be understood that, unless otherwise specified herein, the sequence of the steps is not strictly limited, and the steps may be performed in other orders. Moreover, at least some of the steps may include multiple sub-steps or multiple stages, these sub-steps or stages are not necessarily performed at the same time, but may be performed at different times. These sub-steps or stages are not necessarily to be sequentially performed, but can be performed alternately or in turn with at least some of the sub-steps or stages of other steps.

The various embodiments of the present application are described in a progressive manner, with each embodiment focusing on the differences from other embodiments. The common and similar parts between the embodiments can be referred to each other.

The technical features of the above embodiments can be combined arbitrarily. In order to make the description concise, not all possible combinations of the technical features are described in the embodiments. However, as long as there is no contradiction in the combination of these technical features, the combinations should be considered as in the scope of the present application.

What is claimed is:

1. A solar cell, comprising:
a substrate comprising a front surface and a back surface opposite to each other;
a first emitter having a first doping type;

a second emitter having a second doping type opposite to the first doping type, the first emitter and the second emitter being disposed on the back surface of the substrate;

an insulating spacing structure disposed between the first emitter and the second emitter, the first emitter and the second emitter being spaced from each other by the insulating spacing structure;

a first electrode disposed on a side of the first emitter away from the substrate and electrically connected to the first emitter;

a second electrode disposed on a side of the second emitter away from the substrate and electrically connected to the second emitter; and a remaining doped portion, wherein a material and a doping type of the remaining doped portion are the same as those of the first emitter, and along a direction perpendicular to a thickness direction of the substrate, the remaining doped portion is disposed between the second emitter and the insulating spacing structure;

wherein the insulating spacing structure is annular shaped, the first emitter is disposed in an outer area defined by the insulating spacing structure, and the second emitter is disposed in an inner area defined by the insulating spacing structure.

2. The solar cell according to claim 1, wherein the remaining doped portion is disposed in the inner area defined by the insulating spacing structure.

3. The solar cell according to claim 1, wherein the insulating spacing structure comprises an annular spacing groove.

4. The solar cell according to claim 3, wherein the back surface of the substrate is exposed through the annular spacing groove.

5. The solar cell according to claim 3, wherein a groove width of the annular spacing groove is in a range from 1 μm to 100 μm.

6. The solar cell according to claim 3, wherein the insulating spacing structure further comprises an insulating member disposed in the annular spacing groove.

7. The solar cell according to claim 6, further comprising a back passivation layer, wherein the back passivation layer is disposed on the side of the first emitter away from the substrate and the side of the second emitter away from the substrate.

8. The solar cell according to claim 7, wherein the back passivation layer and the insulating member are an integrated structure.

9. The solar cell according to claim 1, further comprising a passivation contact structure disposed on a surface of the first emitter away from the substrate, wherein the passivation contact structure comprises a tunnel oxide layer and a polysilicon layer, the tunnel oxide layer and the polysilicon layer are sequentially stacked on the first emitter, and the polysilicon layer has the first doping type.

10. The solar cell according to claim 9, wherein a thickness of the tunnel oxide layer is in a range from 1 nm to 2 nm; and/or a thickness of the polysilicon layer is in a range from 10 nm to 300 nm.

11. The solar cell according to claim 9, wherein the back surface of the substrate comprises a first region and a second region outside the first region, the passivation contact structure is disposed in the first region and covers the first region, and the insulating spacing structure is disposed in the second region.

12. The solar cell according to claim 11, wherein the insulating spacing structure comprises a plurality of insulating spacing structures, and the second emitter comprises a plurality of second emitters; the second electrode comprises a connecting portion and a plurality of electrode portions, the plurality of electrode portions are respectively in contact with the plurality of second emitters, the plurality of electrode portions are respectively disposed in an inner area defined by the plurality of insulating spacing structures, the connecting portion is connected to the plurality of electrode portions, and the plurality of electrode portions and the connecting portion are all disposed in the second region.

13. A solar cell, comprising:
a substrate comprising a front surface and a back surface opposite to each other;
a first emitter having a first doping type;
a second emitter having a second doping type opposite to the first doping type, the first emitter and the second emitter being disposed on the back surface of the substrate;
an insulating spacing structure disposed between the first emitter and the second emitter, the first emitter and the second emitter being spaced from each other by the insulating spacing structure;
a first electrode disposed on a side of the first emitter away from the substrate and electrically connected to the first emitter;
a second electrode disposed on a side of the second emitter away from the substrate and electrically connected to the second emitter; and
a remaining doped portion, wherein a material and a doping type of the remaining doped portion are the same as those of the first emitter, and along a direction perpendicular to a thickness direction of the substrate, the remaining doped portion is disposed between the second emitter and the insulating spacing structure;
wherein the insulating spacing structure comprises an annular spacing groove.

14. A method for preparing the solar cell according to claim 1, comprising steps of:
providing a substrate comprising a front surface and a back surface opposite to each other;
forming a first doped layer on the back surface of the substrate, the first doped layer covering the substrate, and the first doped layer having a first doping type;
forming an insulating spacing structure in the first doped layer, thereby allowing the first doped layer located at one side of the insulating spacing structure to be the first emitter;
forming a second emitter at another side of the insulating spacing structure, the second emitter being spaced from the first emitter by the insulating spacing structure, and the second emitter having a second doping type; and
forming a first electrode electrically connected to the first emitter, and forming a second electrode electrically connected to the second emitter.

15. The method according to claim 14, wherein the step of forming the insulating spacing structure comprises:
etching the first doped layer to form an annular spacing groove penetrating through the first doped layer, wherein the insulating spacing structure comprises the annular spacing groove.

16. The method according to claim 15, after forming the annular spacing groove, further comprising cleaning and texturing the substrate by placing the substrate in a texturizing agent, thereby forming a textured structure in the front surface of the substrate.

17. The method according to claim 15, before forming the second emitter, further comprising:
  forming an insulating passivation material on the back surface of the substrate, wherein the passivation material located in the annular spacing groove forms an insulating member, the insulating spacing structure comprises the insulating member, and the passivation material located on the first doped layer forms a back passivation layer.

18. The method according to claim 14, wherein the step of forming the first doped layer comprises:
  sequentially forming a tunnel oxide layer and a silicon material layer on the back surface of the substrate;
  diffusing a doping element into the silicon material layer; and
  annealing the silicon material layer to form a polysilicon layer having a first doping type;
  wherein in the annealing step, the doping element is diffused into the substrate material, thereby forming the first doped layer that covers the substrate.

19. The method according to claim 18, wherein the back surface of the substrate comprises a first region and a second region outside the first region, and after forming the polysilicon layer, the method further comprises:
  removing the polysilicon layer and the tunnel oxide layer in the second region.

* * * * *